(12) United States Patent
Guan et al.

(10) Patent No.: US 12,341,019 B2
(45) Date of Patent: Jun. 24, 2025

(54) ANTI-OXIDATION LAYER TO PREVENT DIELECTRIC LOSS FROM PLANARIZATION PROCESS

(71) Applicant: Taiwan Semiconductor Manufacturing Company, Ltd., Hsinchu (TW)

(72) Inventors: Zhen Yu Guan, Hsinchu (TW); Hsun-Chung Kuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/514,010

(22) Filed: Nov. 20, 2023

(65) Prior Publication Data

US 2024/0087906 A1    Mar. 14, 2024

Related U.S. Application Data

(63) Continuation of application No. 17/337,803, filed on Jun. 3, 2021, now Pat. No. 11,854,822.

(Continued)

(51) Int. Cl.
*H03H 7/01* (2006.01)
*H01F 17/00* (2006.01)
(Continued)

(52) U.S. Cl.
CPC .... *H01L 21/31053* (2013.01); *H01L 21/0223* (2013.01); *H01L 21/02252* (2013.01); *H01L 21/76814* (2013.01)

(58) Field of Classification Search
CPC ........... H01L 21/02074; H01L 21/3212; H01L 21/76814; H01L 21/76834; H01L 21/76863
See application file for complete search history.

(56) References Cited

U.S. PATENT DOCUMENTS

| | | | | |
|---|---|---|---|---|
| 2003/0087513 A1* | 5/2003 | Noguchi | ......... | H01L 21/823871 438/624 |
| 2006/0148255 A1* | 7/2006 | Lu | ...................... | H01L 21/76826 438/692 |

(Continued)

FOREIGN PATENT DOCUMENTS

WO    WO-2006125461 A1 *  11/2006  ......... C11D 11/0047

OTHER PUBLICATIONS

Wagner, Douglas. "How the IPA Vapor Dryer Provides Superior Wafer Processing" Moduteck Corporation. Published on Jan. 8, 2020.

(Continued)

*Primary Examiner* — John A Bodnar
(74) *Attorney, Agent, or Firm* — Eschweiler & Potashnik, LLC

(57) ABSTRACT

In some embodiments, the present disclosure relates to a method that includes forming a dielectric layer over a substrate and patterning the dielectric to form an opening in the dielectric layer. Further, a conductive material is formed within the opening of the dielectric layer. A planarization process is performed to remove portions of the conductive material arranged over the dielectric layer thereby forming a conductive feature within the opening of the dielectric layer. An anti-oxidation layer is formed on upper surfaces of the conductive feature, and then, the anti-oxidation layer is removed.

20 Claims, 16 Drawing Sheets

Related U.S. Application Data

(60) Provisional application No. 63/160,194, filed on Mar. 12, 2021.

(51) Int. Cl.
  *H01L 21/02* (2006.01)
  *H01L 21/3105* (2006.01)
  *H01L 21/768* (2006.01)

(56) References Cited

U.S. PATENT DOCUMENTS

| | | |
|---|---|---|
| 2008/0194116 A1 | 8/2008 | Farkas et al. |
| 2010/0055903 A1 | 3/2010 | Werner et al. |
| 2019/0103308 A1 | 4/2019 | Hsu et al. |
| 2020/0098685 A1 | 3/2020 | Lee et al. |

OTHER PUBLICATIONS

David. "How to Recover Nickel Cobalt Scrap" 911 Metallurgist. Published on Apr. 7, 2018.

Martinson, Erik. "Self assembly" Linkoping University. Published on May 16, 2006.

The Flin Staff. "Standard Reduction Potential Charts" Flinn Scientific. The date of publication is unknown. Retrieved online on Jun. 3, 2021 from https://www.flinnsci.com/standard-reduction-potential-charts/.

Wikipedia.org "Chemical-mechanical polishing" Published on Sep. 7, 2020.

Aldrich et al. "Phosphine interactions with high oxidation state metals" Polyhedron 159 (2019) 284-297, published on Nov. 17, 2018.

University of California Santa Barbara Zakarian Group "Properties of Atoms, Radicals, and Bonds" Published on May 24, 2013.

Chen et al. "The multiple roles of an organic corrosion inhibitor on copper investigated by a combination of electrochemistry-coupled optical in situ spectroscopies" <![CDATA[Corrosion Science]]> (2018), https://doi.org/10.1016/j.corsci.2018.09.018, published on Sep. 27, 2018.

Non-Final Office Action dated Mar. 10, 2023 for U.S. Appl. No. 17/337,803.

Notice of Allowance dated Sep. 8, 2023 for U.S. Appl. No. 17/337,803.

Tan et al. "Passivation of Cu Surface and Its Application in Cu—Cu Bonding for High Density 3D IC Realization" 2012 3rd IEEE International Workshop on Low Temperature Bonding for 3D Integration, published on Jul. 12, 2012.

\* cited by examiner

ANTI-OXIDATION LAYER TO PREVENT DIELECTRIC LOSS FROM PLANARIZATION PROCESS

REFERENCE TO RELATED APPLICATIONS

This Application is a Continuation of U.S. application Ser. No. 17/337,803, filed on Jun. 3, 2021, which claims the benefit of U.S. Provisional Application No. 63/160,194, filed on Mar. 12, 2021. The contents of the above-referenced Patent Applications are hereby incorporated by reference in their entirety.

BACKGROUND

Semiconductor device fabrication is a process used to create integrated circuits that are present in everyday electronic devices. The fabrication process is a multiple-step sequence of photolithographic, chemical, and mechanical processing steps during which electronic circuits are gradually created on a wafer composed of a semiconducting material. Between the processing steps, cleaning processes may be used to remove any contaminant particles to reduce physical and electrical defects in the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
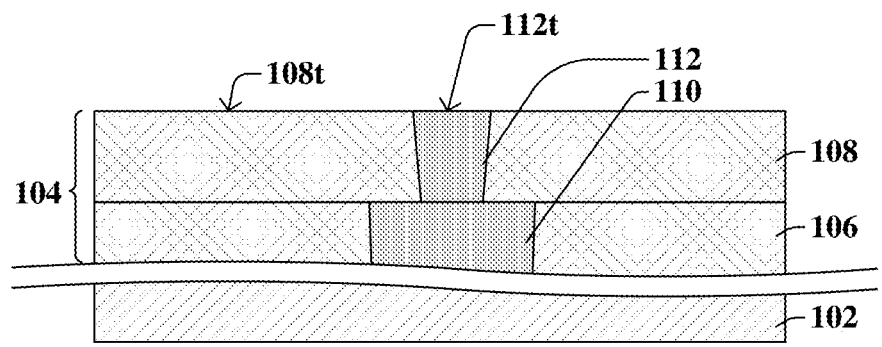
FIG. 1 illustrates a cross-sectional view of some embodiments of an integrated chip comprising a conductive feature extending through a dielectric layer and having a topmost surface substantially coplanar with a topmost surface of the dielectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device often comprises multiple conductive structures arranged within dielectric layers, wherein signals (e.g., current, voltage) can travel through the multiple conductive structures. The conductive structures, dielectric layers, and other features of a semiconductor device may be formed by various steps of deposition, photolithography, and removal processes. For example, a conductive structure may be formed within a dielectric layer by first depositing the dielectric layer, patterning the dielectric layer to form an opening in the dielectric layer, depositing a conductive material within the opening of the dielectric layer, and performing a planarization process to remove excess portions of the conductive material arranged over the dielectric layer. After the planarization process, the conductive structure has a topmost surface that is substantially co-planar with a topmost surface of the dielectric layer.

However, conductive structures often comprise a metal susceptible to oxidation. During cleaning and drying processes after the planarization process (e.g., chemical mechanical planarization (CMP)), the topmost surface of the conductive structure may oxidize, thereby forming an oxide residue. For example, a cleaning process comprising a cleaning solution may be used to clean the conductive structure and the dielectric layer after the planarization process. Then, a drying process may be performed to dry the surfaces of the conductive structure and the dielectric layer. The drying process may use a drying solution that may oxidize an upper surface of the conductive structure. To remove the metal oxide, a dry cleaning process may be used comprising a dry etchant. However, the dry cleaning process may also remove some of the dielectric layer, too, as dielectric layers often comprise oxides. The dielectric layer and the oxide residue may have different rates of removal by the dry cleaning process. As a result, after the dry cleaning process, the topmost surfaces of the conductive structure and the dielectric layer may no longer be co-planar, which can create structural issues in the overall semiconductor device.

Various embodiments of the present disclosure relate to a method of preventing and/or removing an oxide residue on a conductive structure formed during processes conducted after a planarization process. In some embodiments, the method comprises forming an anti-oxidation layer on the topmost surface of the conductive feature after the planarization process and during a drying process to prevent and/or remove oxidation of the conductive feature. In some such embodiments, the anti-oxidation layer comprises a reducing agent and an inhibitor. The reducing agent removes any oxide already formed on the conductive feature, and the inhibitor binds to the conductive feature to prevent more oxidation from occurring on the conductive feature.

Then, in some embodiments, the anti-oxidation layer is removed using a dry cleaning process. In some embodiments, a less harsh dry cleaning process may be used to remove the anti-oxidation layer compared to etching processes used to remove metal-oxide materials. Thus, in some embodiments, the dry cleaning process does not remove the dielectric layer surrounding the conductive feature such that after the removal of the anti-oxidation layer, the topmost surfaces of the conductive feature and the dielectric layer are still substantially coplanar to improve the structural integrity of the overall semiconductor device.

FIG. 1 illustrates a cross-sectional view 100 of some embodiments of an integrated chip comprising an interconnect structure having substantially coplanar conductive features and dielectric layers.

The cross-sectional view 100 of FIG. 1 includes an interconnect structure 104 arranged over a substrate 102. In some embodiments, the interconnect structure 104 comprises at least a first dielectric layer 108 arranged over a second dielectric layer 106. In some embodiments, a first conductive structure 112 is arranged within the first dielectric layer 108, and a second conductive structure 110 is arranged within the second dielectric layer 106. In some embodiments, the first conductive structure 112 is arranged over and directly contacts the second conductive structure 110. In some embodiments, the first conductive structure 112 has a wider topmost surface than a bottommost surface of the first conductive structure 112. In some embodiments, the first conductive structure 112 may be or comprise an interconnect via, and interconnect wire, or the like. In some embodiments, the second conductive structure 110 may be or comprise an interconnect wire, an interconnect via, or the like.

In some embodiments, the conductive features (e.g., 112, 110) of the interconnect structure 104 serve as pathways for signals (e.g., current, voltage) to travel between various semiconductor devices, memory devices, power sources, or some other suitable electronic device. Thus, in some embodiments, the conductive features (e.g., 112, 110) of the interconnect structure 104 are electrically coupled to various semiconductor devices, memory devices, power sources, or some other suitable electronic device.

In some embodiments, the interconnect structure 104 is formed through various steps of deposition, patterning (e.g., photolithography, etching), and removal processes (e.g., etching, chemical mechanical planarization (CMP), etc.). For example, in some embodiments, to form the first conductive structure 112 within the first dielectric layer 108, the first dielectric layer 108 may be deposited over the second dielectric layer 106; the first dielectric layer 108 may be patterned to form an opening in the first dielectric layer 108; the first conductive structure 112 may be formed within the opening of the first dielectric layer 108; and a planarization process (e.g., CMP) may be performed to remove excess material and planarize the first conductive structure 112 and the first dielectric layer 108.

Because of the planarization process, a topmost surface 112t of the first conductive structure 112 is substantially coplanar with a topmost surface 108t of the first dielectric layer 108. In some embodiments, "substantially coplanar" means that the topmost surface 112t of the first conductive structure 112 is between about 0 nanometers and about 2 nanometers above or below the topmost surface 108t of the first dielectric layer 108. When the topmost surface 108t of the first dielectric layer 108 and the topmost surface 112t of the first conductive structure 112 are substantially coplanar, then, more layers, conductive features, and/or devices may be reliably formed over the first dielectric layer 108 and the first conductive structure 112 without sacrificing the structural integrity of the interconnect structure 104.

In some embodiments, to ensure that the topmost surface 112t of the first conductive structure 112 is substantially coplanar with (e.g., between 0 nanometers and 2 nanometers above or below) the topmost surface 108t of the first dielectric layer, an anti-oxidation layer is formed during a post-planarization drying process to prevent the topmost surface 112t of the first conductive structure 112 from oxidizing. Then, when the anti-oxidation layer is later removed, it can be removed without also removing the first dielectric layer 108, thereby preserving the topmost surface 112t of the first conductive structure 112 being substantially coplanar with the topmost surface 108t of the first dielectric layer 108.

Figure 2:
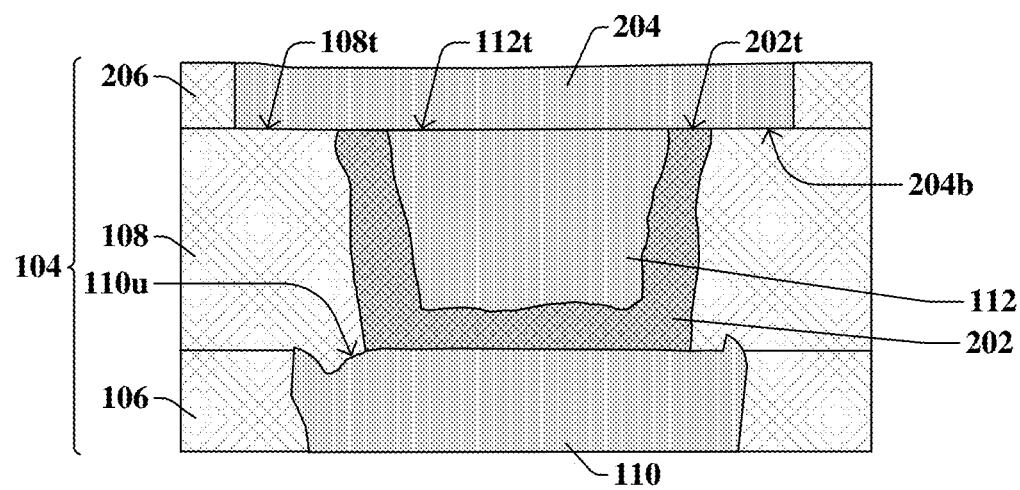
FIGS. 2 and 3 illustrate cross-sectional views of some other embodiments of an integrated chip comprising a conductive feature extending through a dielectric layer and having a topmost surface substantially coplanar with a topmost surface of the dielectric layer.

FIG. 2 illustrates a cross-sectional view 200 of some other embodiments of an integrated chip comprising a first conductive structure extending through a first dielectric layer, wherein the first conductive structure and the first dielectric layer have substantially coplanar topmost surfaces.

In some embodiments, a liner layer 202 is arranged on outer sidewalls and a bottom surface of the first conductive structure 112. In some embodiments, the liner layer 202 acts as an adhesion layer between the first conductive structure 112 and the first dielectric layer 108 and/or as a diffusion barrier layer to prevent the first conductive structure 112 from diffusing into the first dielectric layer 108. In some embodiments, outermost surfaces of the liner layer 202 and the first conductive structure 112 are not substantially planar or substantially curved due to a residual effect of patterning the first dielectric layer 108. In some embodiments, though, the topmost surface 112t of the first conductive structure 112, the topmost surface 108t of the first dielectric layer 108, and a topmost surface 202t of the liner layer 202 are substantially coplanar due to the use of an anti-oxidation layer during fabrication on the first conductive structure 112 and/or the liner layer 202.

Further, in some embodiments, the second conductive structure 110 may not have been formed using an anti-oxidation layer. In some such embodiments, upper surfaces 110u of the second conductive structure 110 may not be substantially planar. However, because of the anti-oxidation layer, the topmost surface 108t of the first dielectric layer, the topmost surface 112t of the first conductive structure 112, and the topmost surface 202t of the liner layer 202 may be substantially coplanar to improve the structural integrity of the overall device. In other embodiments, each conductive structure within an interconnect structure is formed using an anti-oxidation layer to ensure each layer of an interconnect structure is substantially planar to improve the structural integrity of the overall device.

In some embodiments, because of the substantially coplanar topmost surfaces (108t, 112t, 202t), an additional dielectric layer 206 and an additional conductive structure 204 arranged within the additional dielectric layer 206 may be reliably formed over the first dielectric layer 108 and the first conductive structure 112. For example, in some embodiments, a bottommost surface 204b of the additional conductive structure 204 is arranged on a same plane as or above the topmost surface 108t of the first dielectric layer 108. In other words, the additional conductive structure 204 does not extend below the first dielectric layer 108, which may aid in a reduction in cross-talk between the additional conductive structure 204 and other surrounding devices, conductive features, or the like.

Figure 3:
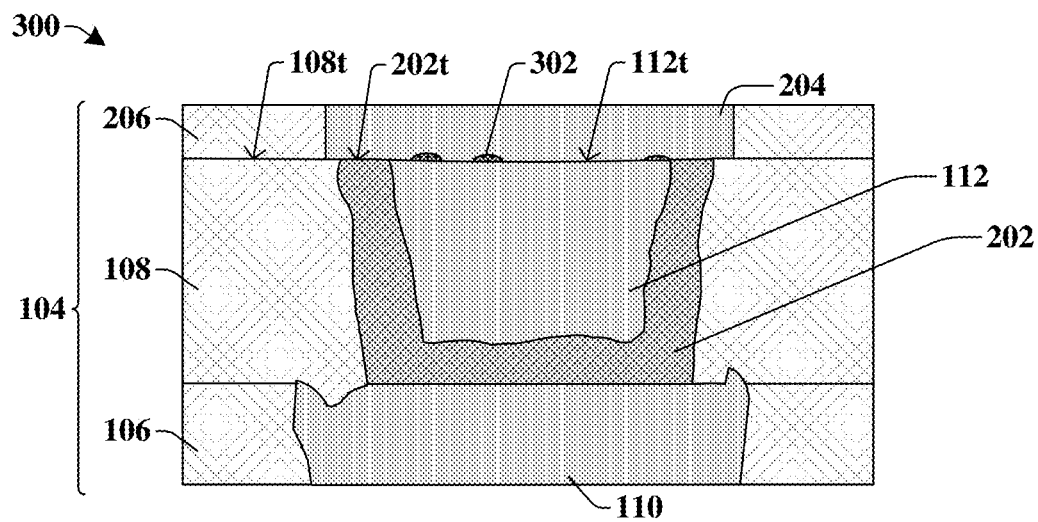

FIG. 3 illustrates a cross-sectional view 300 of some embodiments of FIG. 2.

In some other embodiments, the topmost surface 112t of the first conductive structure 112 may have a slight, upward curved profile from the cross-sectional view 300 of FIG. 3 due to dishing effects from the planarization process. Further, in some embodiments, an anti-oxidation layer residue 302 may be arranged on the topmost surface 112t of the first conductive structure 112. In some embodiments, the anti-oxidation layer used during fabrication is to be completely removed prior to forming the additional dielectric layer 206 or the additional conductive structure 204 over the first conductive structure 112. However, in some embodiments, the anti-oxidation layer is not completely removed from the first conductive structure 112, thereby leaving behind the anti-oxidation layer residue 302 between the first conductive structure 112 and the additional conductive structure 204. In some embodiments, the anti-oxidation layer residue 302 comprises a reducing agent and/or an inhibitor compound. For example, in some embodiments, the anti-oxidation layer residue 302 may comprise, for example, boron, a nitride, hypophosphorous acid, benzotriazole, mercaptobenzothiazole, and/or some other suitable reducing agent or inhibitor compound. In some embodiments, although the anti-oxidation layer residue 302 is present, a substantial portion of the topmost surface 112t of the first conductive structure 112 is free from the anti-oxidation layer residue 302 such that the contact resistance between the first conductive structure 112 and the additional conductive structure 204 is minimally effected.

Figure 4:
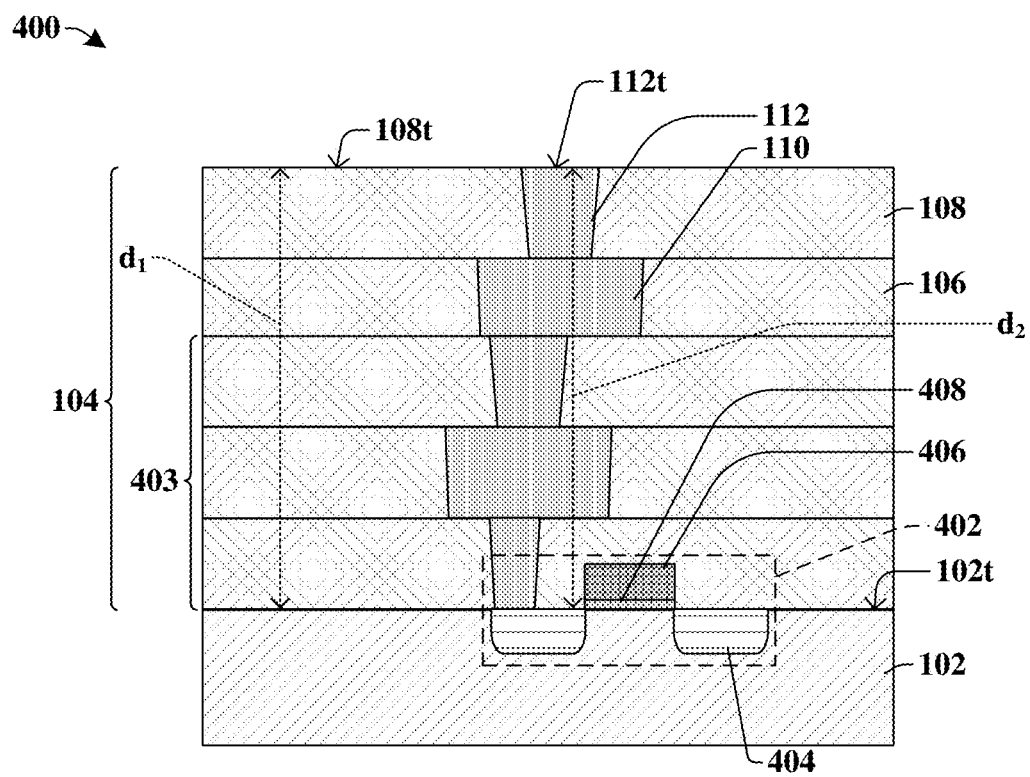
FIG. 4 illustrates a cross-sectional view of some other embodiments of an integrated chip comprising a conductive feature extending through a dielectric layer and having a topmost surface substantially coplanar with a topmost surface of the dielectric layer, wherein the conductive feature is coupled to an underlying semiconductor device.

FIG. 4 illustrates a cross-sectional view 400 of some other embodiments of an integrated chip comprising a conductive feature having a topmost surface substantially coplanar with a topmost surface of the dielectric layer and coupled to an underlying semiconductor device.

In some embodiments, the interconnect structure 104 is coupled to an underlying semiconductor device 402. In some embodiments, the underlying semiconductor device 402 is arranged on or within the substrate 102. In some embodiments, the underlying semiconductor device 402 is or comprises a transistor, such as a planar metal-oxide-semiconductor field effect transistor (MOSFT), a finFET, a gate all-around field effect transistor, or some other transistor device. In some other embodiments, the underlying semiconductor device 402 may be or comprise an optical device, a memory device, or some other suitable electronic device. In some embodiments, the underlying semiconductor device 402 comprises source/drain regions 404 arranged within the substrate 102 and a gate electrode 406 arranged over the substrate 102. In some embodiments, a gate dielectric layer 408 is arranged directly between the gate electrode 406 and the substrate 102.

In some embodiments the interconnect structure 104 further comprises a lower portion 403 of interconnect dielectric layer and interconnect conductive structures coupling the first and second conductive structures 112, 110 to the underlying semiconductor device 402. In some embodiments, the first and second dielectric layers 108, 106 comprise a dielectric material such as, for example, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first and second conductive structures 112, 110 comprise a conductive material such as, for example, tungsten, copper, aluminum, titanium, or some other suitable conductive material.

Thus, in some embodiments, the first and second conductive structures 112, 110 comprise a conductive material that is susceptible to oxidation. To prevent oxidation and/or reduce any oxidation to remove oxidation, an anti-oxidation layer comprising a reducing agent and an inhibitor compound is formed on the first and second conductive structures 112, 110 during certain steps of fabrication, and then is later removed. In some embodiments, the removal of the anti-oxidation layer does not remove the interconnect dielectric layers (e.g., 106, 108). Thus, in some embodiments, the topmost surface 112t of the first conductive structure 112 is coplanar with the topmost surface 108t of the first dielectric layer 108. In some such embodiments, the topmost surface 108t of the first dielectric layer 108 is arranged at a first distance d1 above a topmost surface 102t of the substrate 102, and the topmost surface 112t of the first conductive structure 112 is arranged at a second distance d2 above the topmost surface 102t of the substrate 102, wherein the second distance d2 is about equal to the first distance di.

FIGS. 5-16B illustrate various views 500-1600B of some embodiments of a method of forming a conductive feature in a dielectric layer, wherein during a post-planarization drying process, an anti-oxidation layer is formed over the conductive feature such that after the post-planarization drying process, a topmost surface of the conductive feature is substantially coplanar with a topmost surface of the dielectric layer. Although FIGS. 5-16B are described in relation to a method, it will be appreciated that the structures disclosed in FIGS. 5-16B are not limited to such a method, but instead may stand alone as structures independent of the method.

Figure 5:
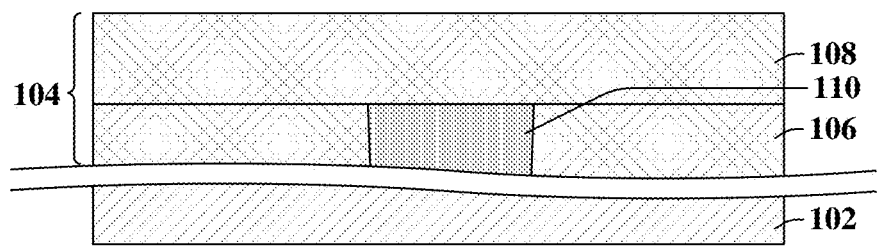
FIGS. 5-16B illustrate various views of some embodiments of a method of forming a conductive structure within a dielectric layer through various steps of deposition, patterning, and removal processes, wherein after a planarization process, an anti-oxidation layer is formed on the conductive structure such that after processing steps, a topmost surface of the conductive structure is substantially coplanar with a topmost surface of the dielectric layer.

As shown in cross-sectional view 500 of FIG. 5, a substrate 102 is provided. In some embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, an interconnect structure 104 is formed over the substrate 102 through various steps of deposition (e.g., physical vapor deposition (PVD), chemical vapor deposition (CVD), atomic layer deposition (ALD), sputtering, etc.), patterning (e.g., photolithography/etching), and removal processes (e.g., etching, chemical mechanical planarization (CMP), etc.). In some embodiments, the interconnect structure 104 comprises multiple layers of dielectric materials and interconnect conductive structures (e.g., contact vias, interconnect vias, interconnect wires, etc.) that electrically couple various devices to one another.

Thus, in some embodiments, part of the interconnect structure 104 is formed by depositing a second dielectric layer 106 over the substrate 102. In some embodiments, the second dielectric layer 106 may comprise a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, a second conductive structure 110 is then formed within the second dielectric layer 106 and extends completely through the second dielectric layer 106. In some embodiments, the second conductive structure 110 is formed over some other underlying conductive structure or semiconductor device. In some embodiments, the second conductive structure 110 comprises a conductive material such as, for example, tungsten, copper, aluminum, titanium, or some other suitable conductive material.

In some embodiments, a first dielectric layer 108 may be formed of the second dielectric layer 106. In some embodiments, the first dielectric layer 108 is formed by way of a deposition process (e.g., PVD, CVD, ALD, etc.). In some embodiments, the first dielectric layer 108 comprises a dielectric material, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some other embodiments (not shown), an etch stop layer may be arranged between the first dielectric layer 108 and the second dielectric layer 106.

Figure 6:
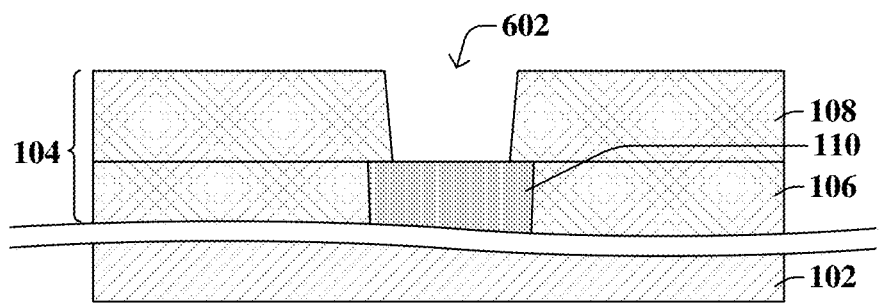

As shown in cross-sectional view 600 of FIG. 6, in some embodiments, an opening 602 is formed within the first dielectric layer 108 to expose the second conductive structure 110. Thus, in some embodiments, the opening 602 extends completely through the first dielectric layer 108. In some embodiments, the opening 602 is formed by forming a masking structure over the first dielectric layer 108 through photolithography and etching. Then, in some embodiments, a removal process (e.g., wet etching, dry etching) is performed to remove a portion of the first dielectric layer 108 according to the masking structure to form the opening 602 in the first dielectric layer 108. In some embodiments, the masking structure may then be removed from the first dielectric layer 108.

Figure 7:
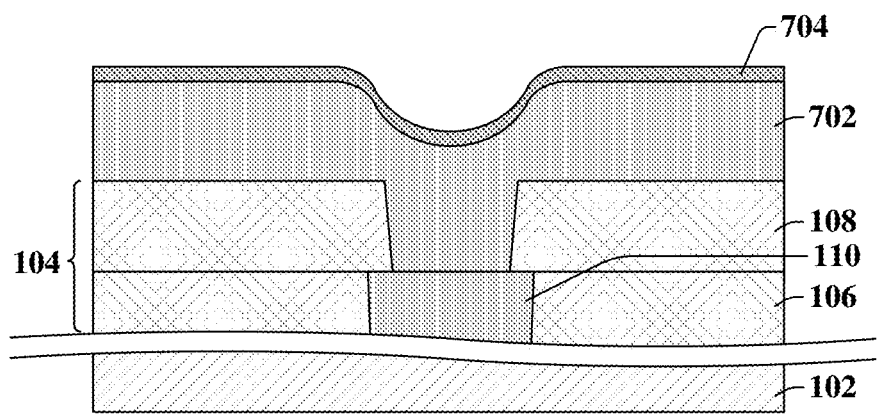

As shown in cross-sectional view 700 of FIG. 7, in some embodiments, a conductive material 702 is formed within the opening (602 of FIG. 6) of the first dielectric layer 108 and over the first dielectric layer 108. In some embodiments, the conductive material 702 comprises, for example, tungsten, copper, aluminum, titanium, or some other suitable conductive material. In some embodiments, the conductive material 702 is formed by way of a deposition process (e.g., PVD, CVD, ALD, sputtering, etc.). In some embodiments, the conductive material 702 comprises a metal that is susceptible to oxidation when exposed to air. Thus, in some embodiments, a native oxidation layer 704 is formed on upper surfaces of the conductive material 702 during and/or after the formation of the conductive material 702.

Figure 8:
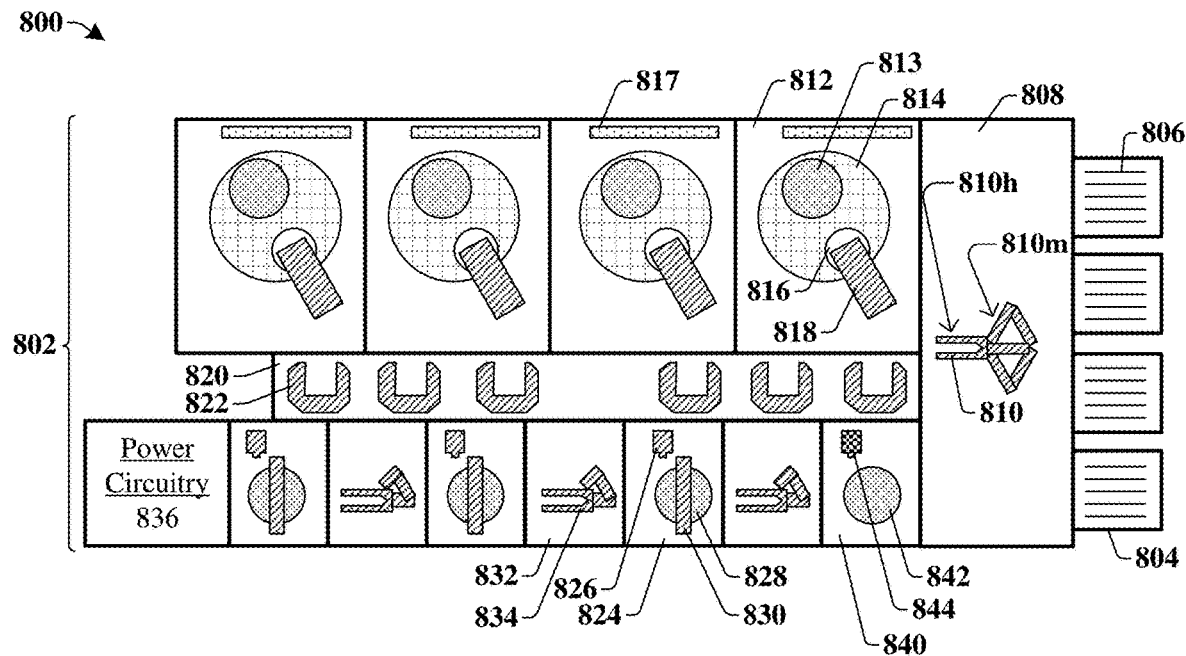

FIG. 8 illustrates a top-view schematic 800 of some embodiments of a planarization apparatus configured to planarize layers arranged on a substrate.

As will be discussed in cross-sectional view 900 of FIG. 9, in some embodiments, after the deposition of the conductive material (702 of FIG. 7), the substrate (102 of FIG. 7) is transported into a planarization apparatus 802 to remove portions of the conductive material (702 of FIG. 7) arranged over the first dielectric layer (108 of FIG. 7).

In some embodiments, as shown in FIG. 8, the planarization apparatus 802 comprises a wafer storage unit 804 that comprises multiple wafer holding structures 806. In some embodiments, after the formation of the conductive material (702 of FIG. 7), the substrate (102 of FIG. 7) may be transported into one of the wafer storage units 804 from some other deposition chamber. In some embodiments, the wafer storage unit 804 may be or comprise cassettes, a front opening unified pod (FOUP) or some other storage structure that may hold multiple wafer structures on the multiple wafer holding structures 806. In some embodiments, the wafer storage unit 804 is a moveable pod that may be interchanged with a new wafer storage unit (e.g., 804) to continuously process multiple wafer structures. In some embodiments, more than one wafer storage unit 804 may be coupled to the planarization apparatus 802 at the same time such that many wafer structures may be available to enter into the planarization apparatus 802 at any time to improve processing efficiency.

In some embodiments, the one or more wafer storage units 804 are coupled to a first transport chamber 808. In some embodiments, the first transport chamber 808 comprises a first transport robot 810. In some embodiments, the first transport robot 810 comprises a moveable portion 810m configured to reach any of the wafer storage units 804 and a holding portion 810h configured to pick up a wafer structure from the wafer storage unit 804 for transport into another chamber. Thus, in some embodiments, the holding portion 810h comprises some type of finger-like, clamp portion configured to hold onto the wafer structure that does not damage the wafer structure during transport.

In some embodiments, the first transport robot 810 is configured to transport a wafer structure between the wafer storage unit 804 and a second transport chamber 820. In some embodiments, the second transport chamber 820 is arranged between planarization chambers 812 and a post-planarization drying chamber 840. In some embodiments, the second transport chamber 820 comprises second transport robots 822 configured to hold onto wafer structures between processing steps and/or to transport the wafer structures between the first transport chamber 808, the planarization chambers 812, the post-planarization cleaning chambers 824, and/or third transport chambers 832.

In some embodiments, the planarization chambers 812 each comprise a polishing pad chuck 814, a conditioner pad 816 coupled to a conditioner pad arm 818, a slurry pipe 817, and a wafer chuck 813 arranged over the polishing pad chuck 814. In some embodiments, post-planarization cleaning chambers 824 are arranged below the second transport chamber 820 such that wafer structures are transported by the second transport robots 822 from the planarization chambers 812 to the post-planarization cleaning chambers 824. In some embodiments, the post-planarization cleaning chambers 824 each comprise a wafer cleaning chuck 828, a brush apparatus 830, and a cleaning solution dispenser 826. In some embodiments, the third transport chambers 832 each comprise a third transport robot 834.

In some embodiments, a post-planarization drying chamber 840 is arranged between the post-planarization cleaning chambers 824 and the first transport chamber 808. In some such embodiments, the third transport robots 834 and/or the second transport robots 822 may transport the wafer structures from the post-planarization cleaning chambers 824 and into the post-planarization drying chamber 840. In some embodiments, the post-planarization drying chamber 840 comprises a wafer drying chuck 842 and a drying solution dispenser 844. After a wafer structure is processed in the post-planarization drying chamber 840, the first transport robot 810 may transport the wafer structure back into one of the wafer storage units 804. In some embodiments, the planarization apparatus 802 is controlled by power circuitry 836 coupled to each of the chambers (e.g., 808, 812, 820, 824, 832).

Figure 9:
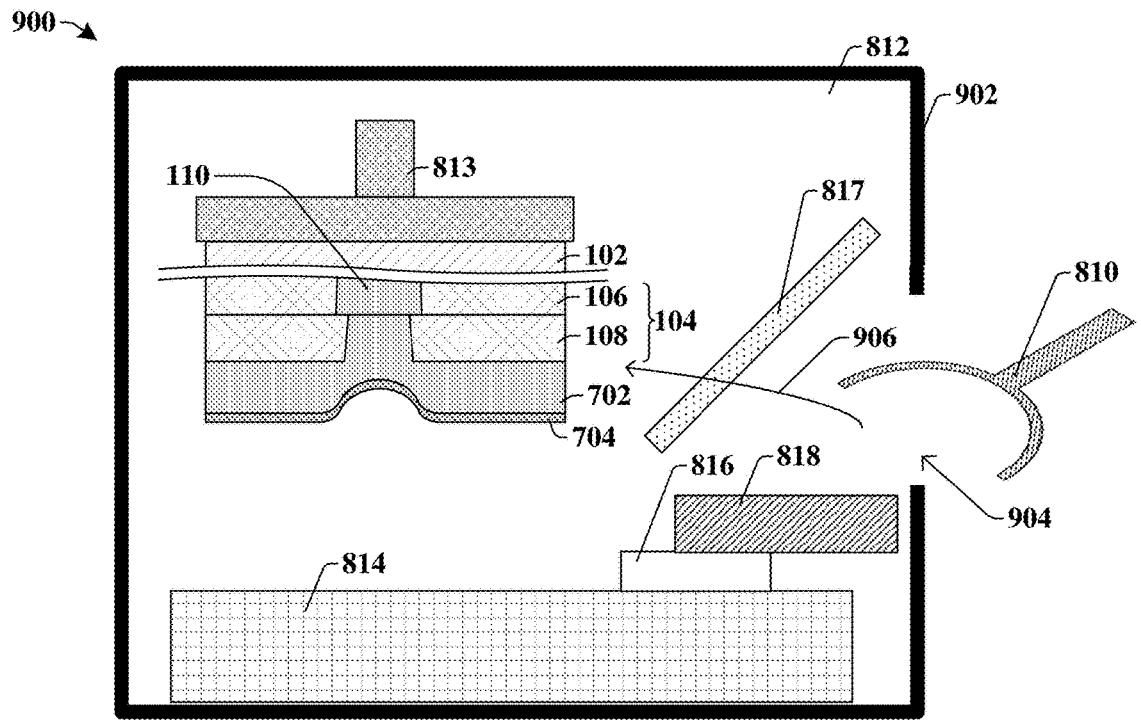

As shown in cross-sectional view 900 of FIG. 9, in some embodiments, the substrate 102 is transported 906 by the first transport robot 810 from one of the wafer storage units 804 and into one of the planarization chambers 812. In some other embodiments, the substrate 102 may be transported into the planarization chamber 812 by one of the second transport robots 822. Nevertheless, in some embodiments, the planarization chamber 812 is defined by planarization housing 902, which may be opened 904 such that the substrate 102 can be transported into the planarization chamber 812. In some embodiments, the substrate 102 is arranged on the wafer chuck 813, wherein the wafer chuck 813 faces the polishing pad chuck 814. In some embodiments, the conductive material 702 and the native oxidation layer 704 directly overlie and face the polishing pad chuck 814. Thus, in some embodiments, the substrate 102, interconnect structure 104, and the conductive material 702 are upside down in FIG. 9 compared to the configuration as seen in FIG. 7, for example.

Figure 10:
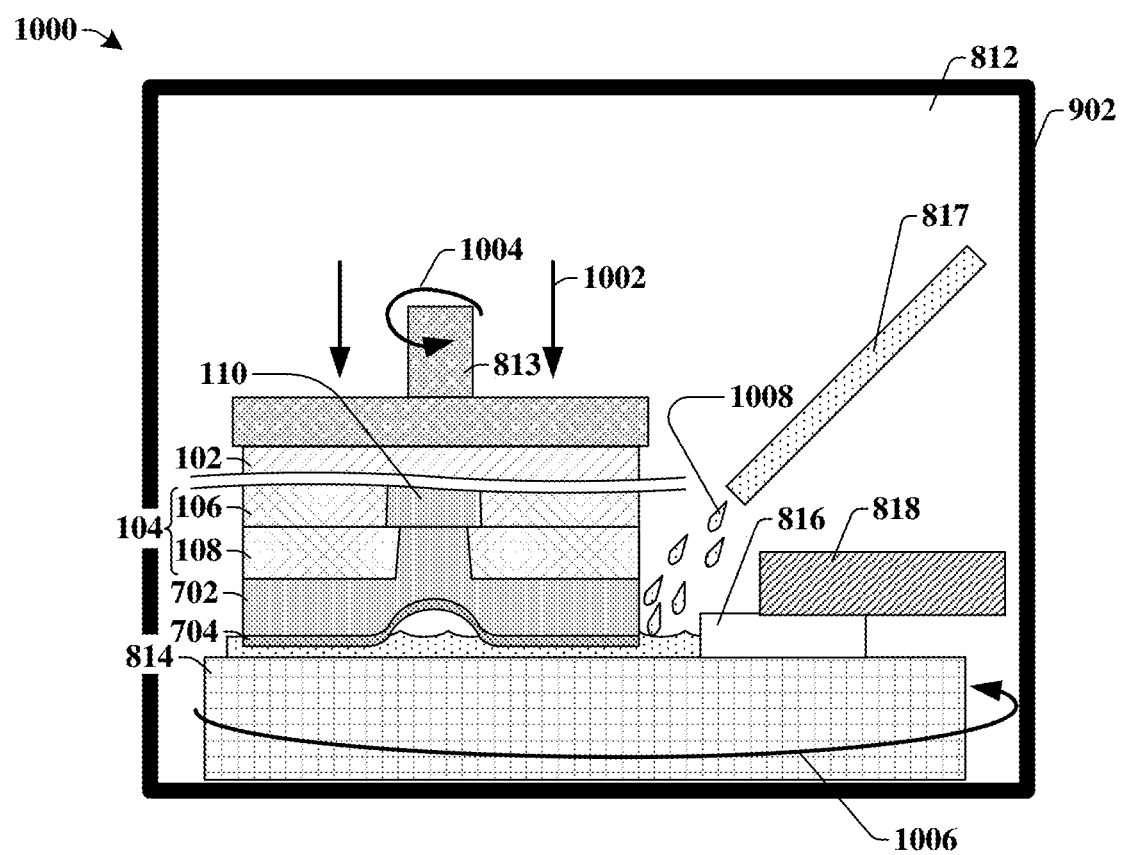

As shown in cross-sectional view 1000 of FIG. 10, in some embodiments, the planarization housing 902 is closed, and a planarization process is started. The planarization process may be controlled by the power circuitry (836 of FIG. 8). In some embodiments, the wafer chuck 813 is moved toward the polishing pad chuck 814, as indicated by arrows 1002. Further, in some embodiments, the wafer chuck 813 begins rotating as illustrated by arrow 1004. In some embodiments, the slurry pipe 817 dispenses a slurry 1008 onto the polishing pad chuck 814, and the polishing pad chuck begins rotating as illustrated by arrow 1006. In some embodiments, the conditioner pad arm 818 is also turned on. In some embodiments, the main solvent of the slurry 1008 is water. In some embodiments, these various components of the planarization process within the planarization chamber 812 are turned "ON" at a same time and/or at staggering times. In some embodiments, removal of a material/layer begins once the material/layer contacts the slurry 1008 and/or polishing pad chuck 814.

Figure 11:
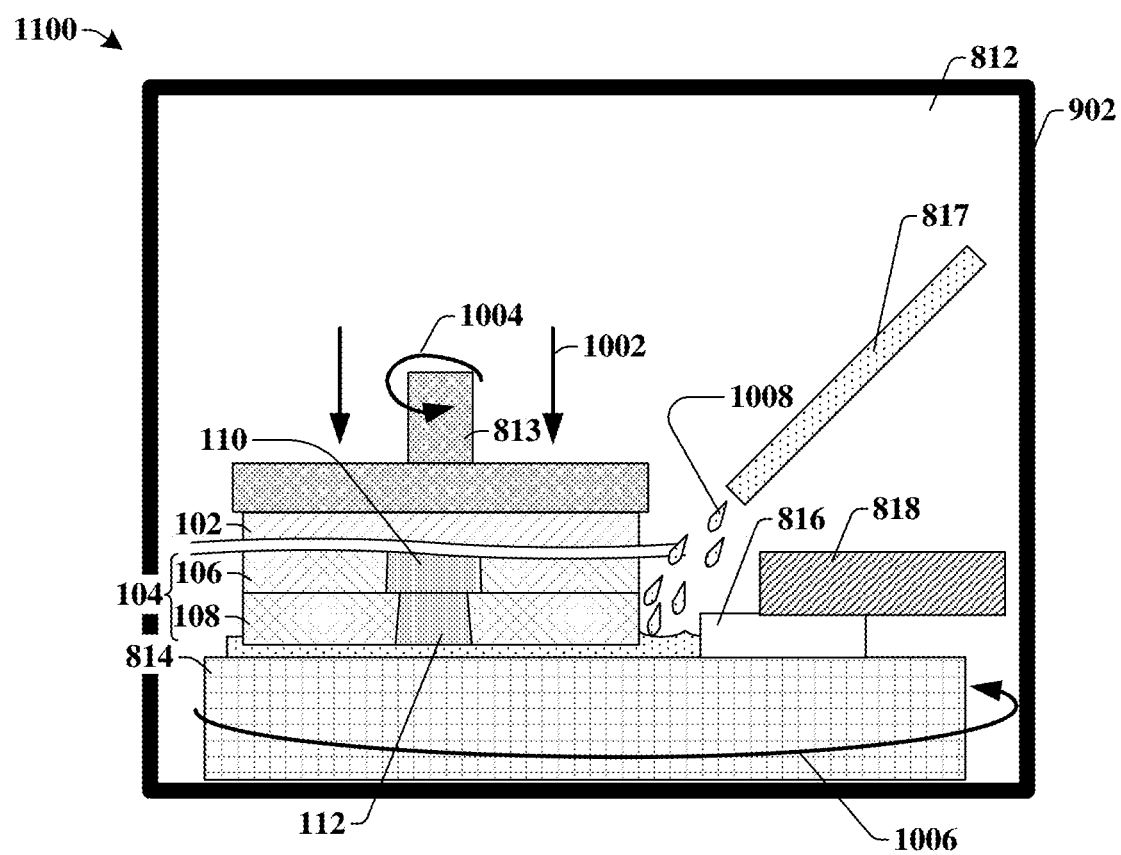

As shown in cross-sectional view 1100 of FIG. 11, in some embodiments, the planarization process progresses to remove the native oxidation layer (704 of FIG. 10) and portions of the conductive material (702 of FIG. 10). The remaining portion of the conductive material (702 of FIG. 10) forms a first conductive structure 112 arranged within the opening (602 of FIG. 6) of the first dielectric layer 108. In some embodiments, the planarization process described in FIGS. 10 and 11 is a chemical mechanical planarization (CMP) process because chemical etching by the slurry 1008 and mechanical polishing by the polishing pad chuck 814 are utilized to remove portions of a layer (e.g., native oxidation layer 704 and conductive material 702). In some embodiments, the planarization process is stopped when all portions of the conductive material (702 of FIG. 10) arranged on the first dielectric layer 108 are removed and when the resulting first conductive structure 112 is substantially coplanar with the first dielectric layer 108.

Figure 12:
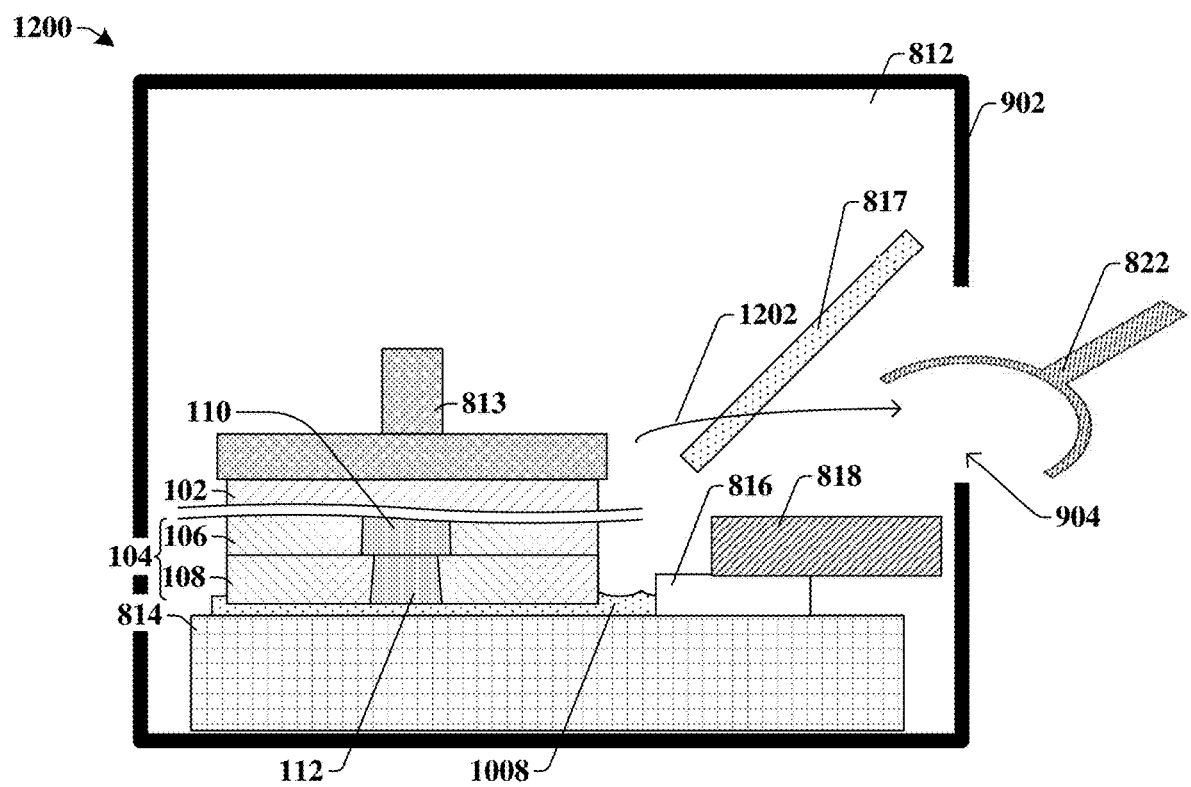

As shown in cross-sectional view 1200 of FIG. 12, in some embodiments the planarization process is stopped by the power circuitry (836 of FIG. 8), the planarization housing 902 is opened 904, and the second transport robot 822 transports 1202 the substrate 102 out of the planarization chamber 812. In some embodiments, the first or third transport robots (810, 834) may instead by used to transport the substrate 102 out of the planarization chamber 812.

Figure 13A:
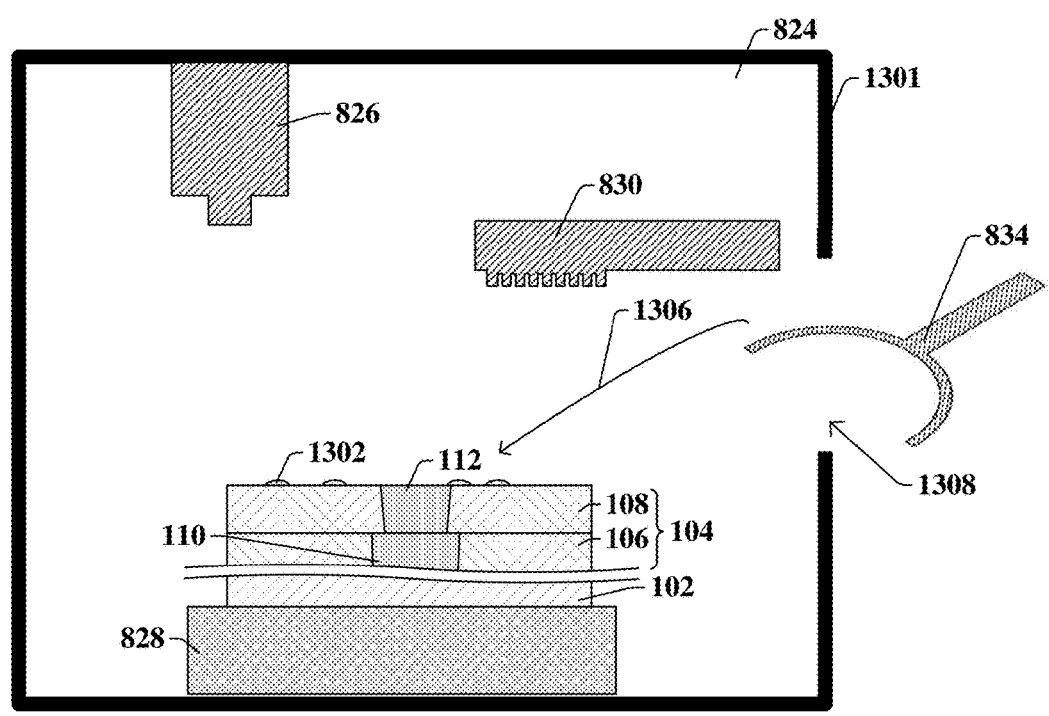

As shown in cross-sectional view 1300A of FIG. 13A, in some embodiments, the second transport robot 822 may be used to transport 1306 the substrate 102 into the post-planarization cleaning chamber 824 and onto the wafer cleaning chuck 828 in the post-planarization cleaning chamber 824. In some embodiments, the post-planarization cleaning chamber 824 is defined by cleaning chamber housing 1301, and the cleaning chamber housing 1301 is opened, as illustrated by arrow 1308, as the substrate 102 is transported into the post-planarization cleaning chamber 824. In some other embodiments, the substrate 102 is transported from the planarization chamber (812 of FIG. 12) to the post-planarization cleaning chamber 824 using the third transport robot 834.

In some embodiments, the substrate 102 is transported into the post-planarization cleaning chamber 824 to undergo a post-planarization cleaning process because a planarization residue 1302 is formed during the planarization process on upper surfaces of the first dielectric layer 108 and/or the first conductive structure 112. In some embodiments, the planarization residue 1302 comprises the slurry (1008 of FIG. 12), portions of the first dielectric layer 108, portions of the first conductive structure 112 and/or a metal-oxide formed from the first conductive structure 112 oxidizing from the air in the environment and/or the slurry (1008 of FIG. 12). In some embodiments, if it is not removed, the planarization residue 1302 may cause physical and/or electrical damage to the overall interconnect structure 104.

Figure 13B:
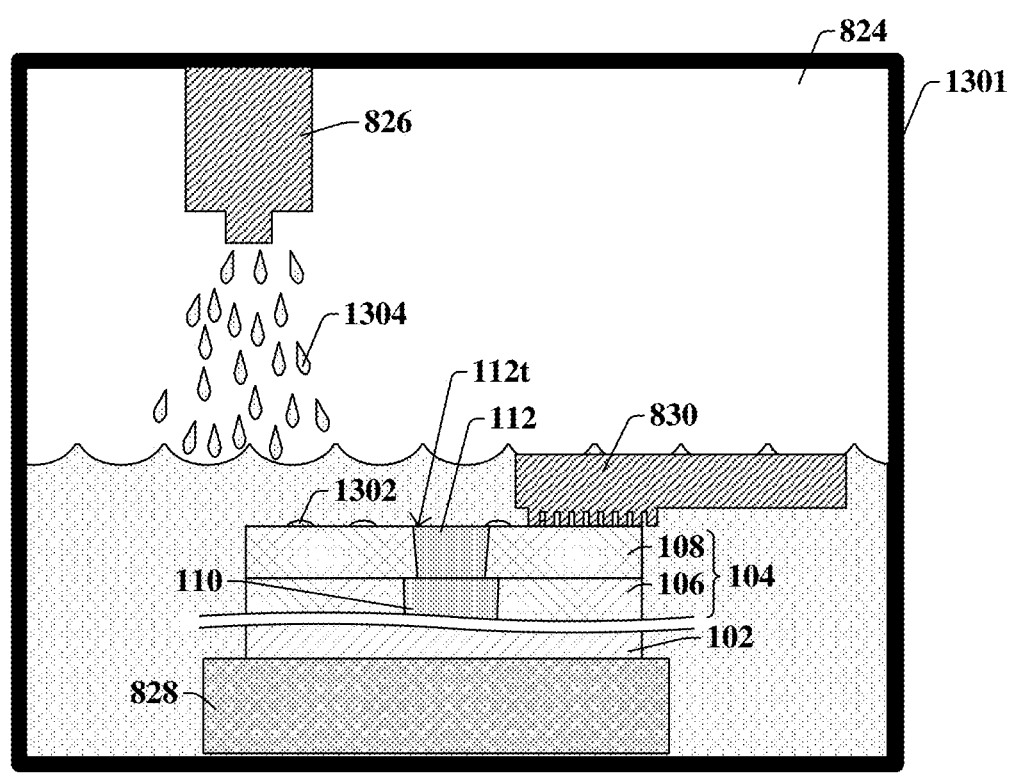

As shown in cross-sectional view 1300B of FIG. 13B, in some embodiments, the cleaning chamber housing 1301 is "closed," and the post-planarization cleaning process is conducted.

In some embodiments, the post-planarization cleaning process comprises a brush apparatus 830 configured to dislodge and remove any planarization residue 1302 and a cleaning solution 1304 dispensed by a cleaning solution dispenser 826 towards the substrate 102 and configured to clean off the planarization residue 1302. In some embodiments, the wafer cleaning chuck 828 may also rotate during the post-planarization cleaning process to help dislodge the planarization residue 1302 and/or dry the first dielectric layer 108 and the first conductive structure 112. In some embodiments, the cleaning solution 1304 fills up the post-planarization cleaning chamber 824, whereas in some other embodiments, the cleaning solution 1304 is dispensed directly onto the first dielectric layer 108 as a thin layer and does not fill up the post-planarization cleaning chamber 824. In some embodiments, the main solvent of the cleaning solution 1304 comprises water, for example.

Figure 13C:
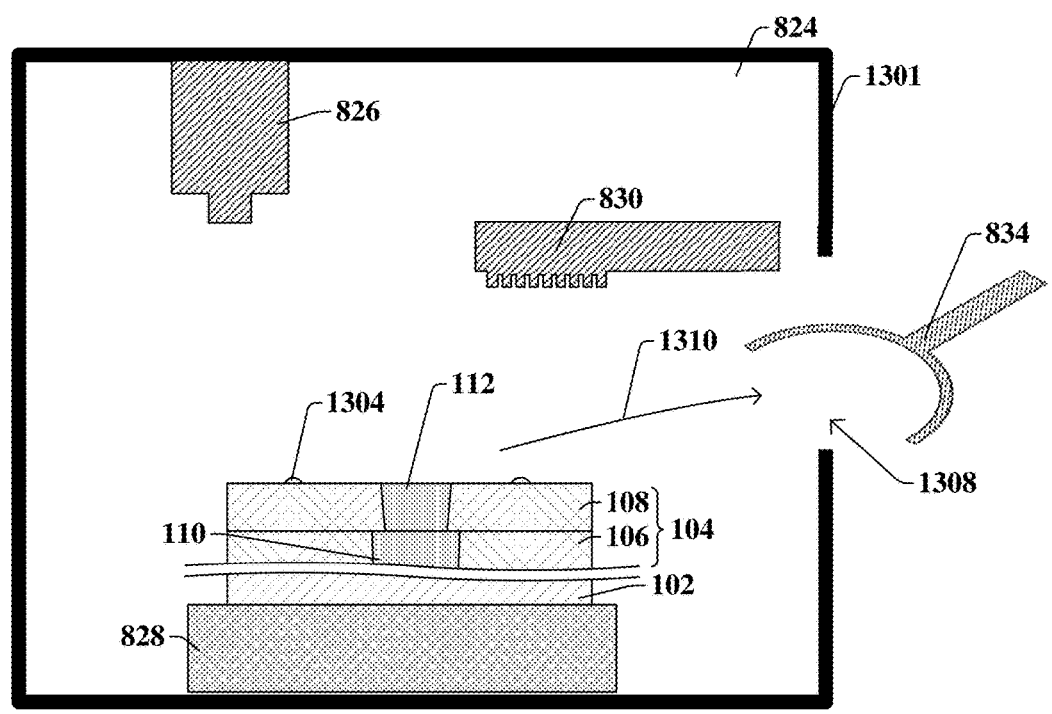

As shown in cross-sectional view 1300C of FIG. 13C, in some embodiments, the post-planarization cleaning process is concluded. In some embodiments, a majority of the cleaning solution 1304 is removed from the post-planarization cleaning chamber 824. However, in some embodiments, small amounts of the cleaning solution 1304 may remain on the first dielectric layer 108 and/or the first conductive structure 112. In some embodiments, when the post-planarization cleaning process is finished, the post-planarization cleaning chamber 824 is opened 1308, and the third transport robot 834 transports 1310 the substrate 102 out of the post-planarization cleaning chamber 824. In some other embodiments, the second transport robot (822 of FIG. 8) may transport 1310 the substrate 102 out of the post-planarization cleaning chamber 824.

Figure 14A:
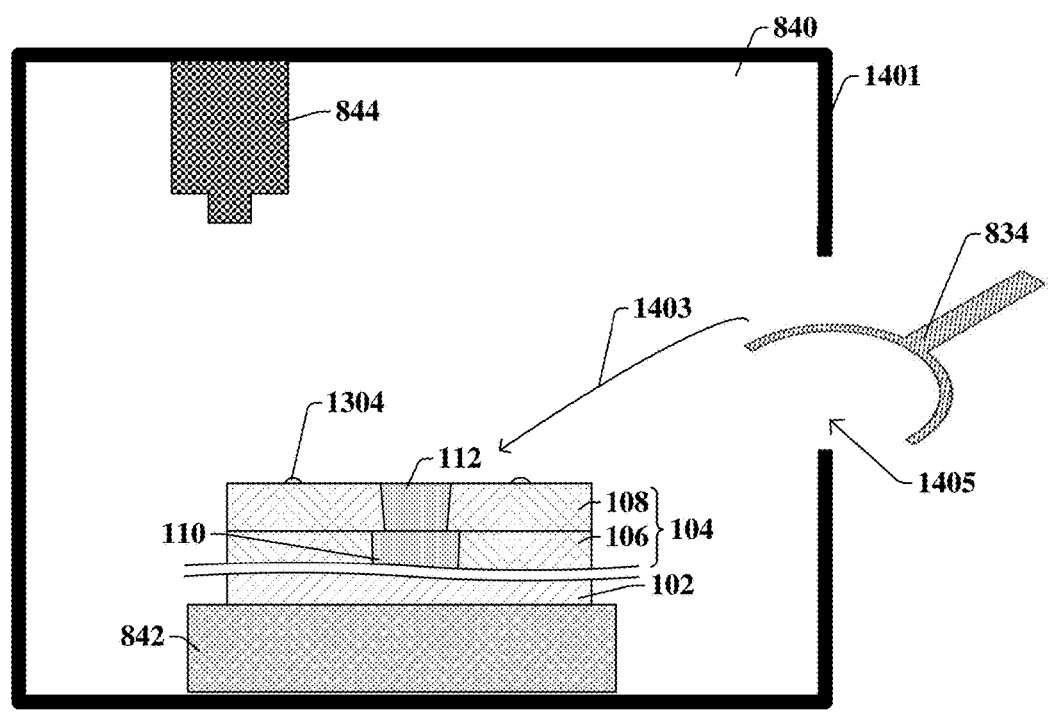

As shown in cross-sectional view 1400A of FIG. 14A, in some embodiments, the third transport robot 834 may be used to transport 1403 the substrate 102 into the post-planarization drying chamber 840 and onto the wafer drying chuck 842 in the post-planarization drying chamber 840. In some embodiments, the post-planarization drying chamber 840 is defined by drying chamber housing 1401, and the drying chamber housing 1401 is opened, as illustrated by arrow 1405, as the substrate 102 is transported 1403 into the post-planarization drying chamber 840.

In some embodiments, the substrate 102 is transported into the post-planarization drying chamber 840 to undergo a post-planarization drying process because small amounts of the cleaning solution 1304 remain on the first dielectric layer 108 and/or the first conductive structure 112 after the post-planarization cleaning process. In some embodiments, if it is not removed, the cleaning solution 1304 may cause physical and/or electrical damage to the overall interconnect structure 104.

Figure 14B:
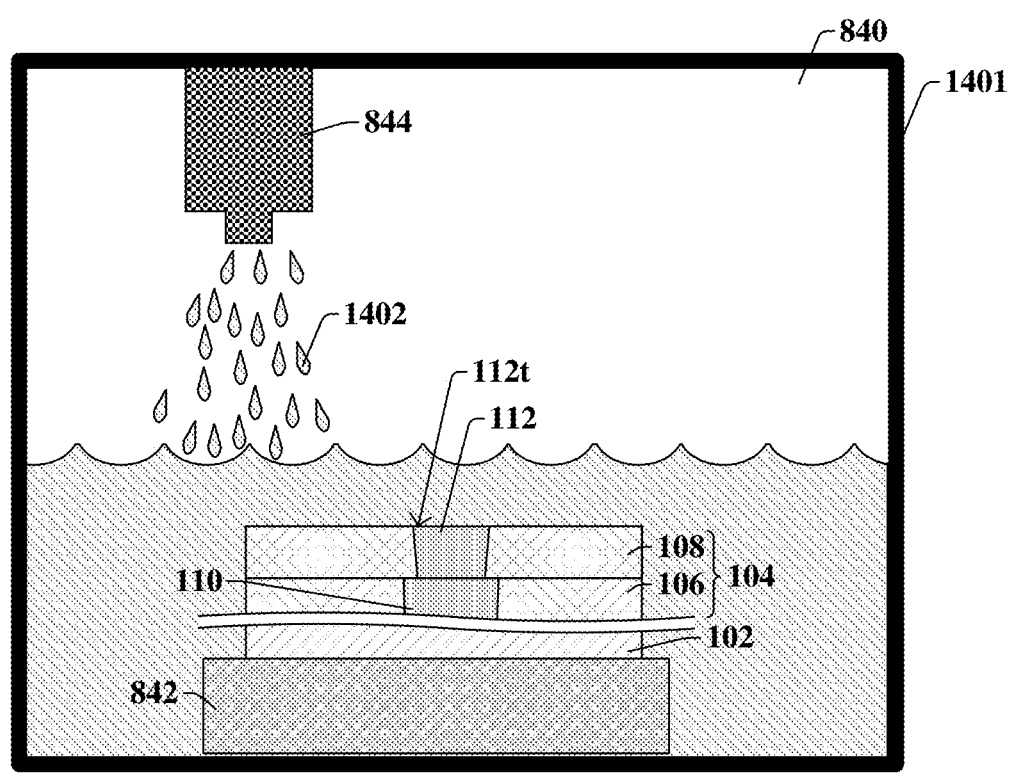

As shown in cross-sectional view 1400B of FIG. 14B, in some embodiments, the cleaning chamber housing 1301 is "closed," and the post-planarization cleaning process is started when the drying solution dispenser 844 applies a drying solution 1402 to the first dielectric layer 108 and the first conductive structure 112. In some embodiments, the drying solution 1402 is configured to aid in cleaning and drying the first dielectric layer 108 and the first conductive structure 112. In some embodiments, the drying solution 1402 comprises multiple solutions and/or various compounds dissolved in a solution. In some embodiments, the wafer drying chuck 842 may also rotate during the post-planarization drying process to help dry the first dielectric layer 108 and the first conductive structure 112. In some embodiments, the drying solution 1402 fills up the post-planarization drying chamber 840, whereas in some other embodiments, the drying solution 1402 is dispensed directly onto the first dielectric layer 108 as a thin layer and does not fill up the post-planarization drying chamber 840.

In some embodiments, drying solution 1402 comprises, for example, isopropyl alcohol, hydrogen peroxide, or some other suitable solution. However, in some such embodiments, because the first conductive structure 112 is susceptible to oxidation, the main solvent of the drying solution 1402, such as the isopropyl alcohol or hydrogen peroxide, may oxidize the first conductive structure 112. Therefore, the drying solution 1402 also comprises a reducing agent and an inhibitor compound. In some embodiments, the drying solution 1402 comprises a mixture/solution of the main solvent, the reducing agent, and the inhibitor compound that are applied to the first dielectric layer 108 and the first conductive structure 112 at a same time.

In some embodiments, the reducing agent reduces portions of the planarization residue 1302 comprising a metal-oxide from the first conductive structure 112, thereby breaking down the metal-oxide as stable metal and as oxygen in the form of a gas, water vapor, or the like. The reducing agent used in the drying solution 1402 is dependent on the material of the first conductive structure 112. The redox reaction of the reducing agent selected must have a standard electrode potential that has a more negative value than the standard electrode potential of the reduction reaction of the metal oxide from the first conductive structure 112. For example, in some embodiments, the first conductive structure 112 comprises tungsten, and thus, the reducing agent used in the drying solution 1402 may comprise, for example, a nitrogen hydrogen compound, hypophosphorous acid, or some other reducing agent that has a standard electrode potential that is more negative than the standard electrode potential of the reduction reaction of the metal-oxide from the first conductive structure 112. Thus, any metal-oxide formed on the first dielectric layer 108 and/or first conductive structure 112 is removed by the reducing agent in the drying solution 1402.

In some embodiments, the inhibitor compound is configured to provide a protection layer on the first conductive structure 112 to prevent more of the first conductive structure 112 from oxidizing. In some embodiments, the inhibitor compound also is dependent upon the material of the first conductive structure 112. In some embodiments, the inhibitor compound binds or adsorbs to the topmost surface 112$t$ of the first conductive structure 112 because the inhibitor compound comprises a lone pair of electrons. In some embodiments, the lone pair of electrons is on a nitrogen, sulfur, or phosphorous atom, for example. In some embodiments, for example, the inhibitor compound within the drying solution 1402 comprises, for example, hypophosphorous acid, benzotriazole, mercaptobenzothiazole, a thiol solution, and/or some other inhibitor compound.

At least the hypophosphorous acid is a tautomer compound, wherein the reducing agent $HOP(O)H_2$ is in equilibrium with inhibitor compound $HP(OH)_2$. In such situations, wherein a compound is a tautomer in equilibrium as a reducing agent structure and an inhibitor structure, then only that compound may be added to the main solvent of the drying solution 1402. In some such embodiments, the reducing agent and the inhibitor compound comprise the same material. In some other embodiments, a tautomer may not be used, or a tautomer and a non-tautomer may be used in the drying solution 1402 such that the reducing agent is a different material than the inhibitor compound.

Because the inhibitor compound is bound to the topmost surface 112$t$ of the first conductive structure 112, re-oxidation of the topmost surface 112$t$ of the first conductive structure 112 is avoided. Thus, in some embodiments, during the post-planarization drying process, the first dielectric layer 108 and the first conductive structure 112 are dried; the reducing agent in the drying solution 1402 removes any metal-oxide from the planarization residue 1302 or formed from the drying solution 1402 by way of a reduction reaction; and the inhibitor compound in the drying solution 1402 prevents metal-oxide from reforming to clean the topmost surface 112$t$ of the first conductive structure 112.

Figure 14C:
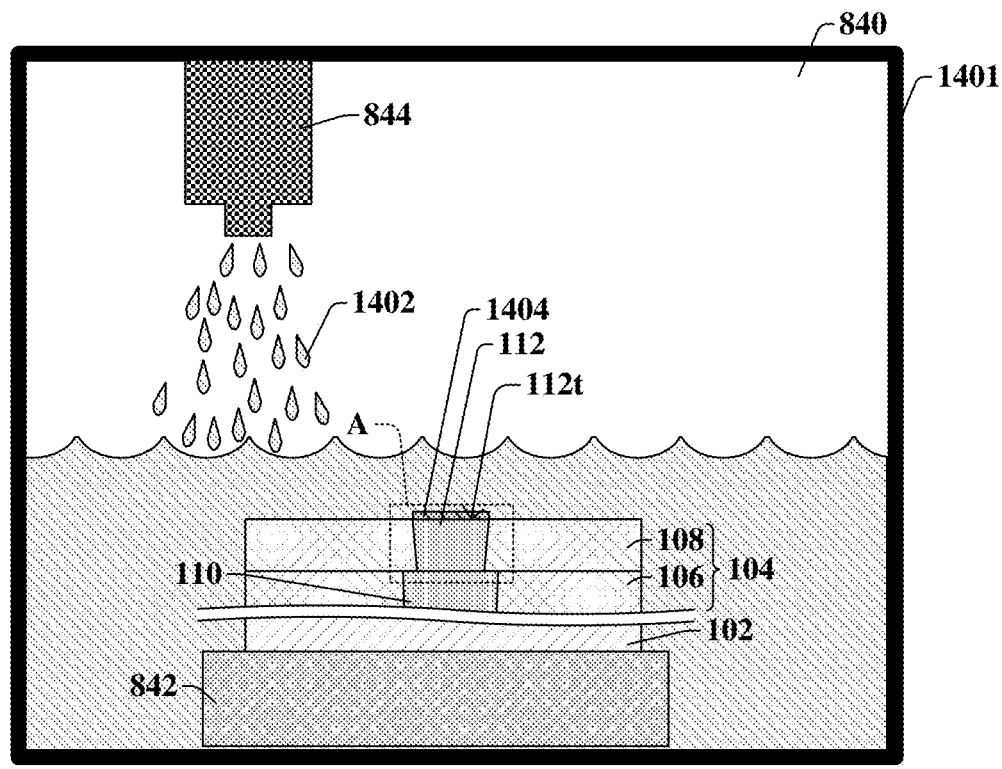

As shown in cross-sectional view 1400C of FIG. 14C, in some embodiments, as the post-planarization drying process progresses in time from FIG. 14B to FIG. 14C, an anti-oxidation layer 1404 is formed on the topmost surface 112$t$ of the first conductive structure 112 during the post-planarization cleaning process. In some embodiments, the anti-oxidation layer 1404 is formed during the progression of the post-planarization drying process in FIGS. 14B and/or 14C. In some embodiments, the anti-oxidation layer 1404 comprises the inhibitor compound that is bound to the topmost surface 112$t$ of the first conductive structure 112 to prevent the first conductive structure 112 from re-oxidizing. Further, in some embodiments, the anti-oxidation layer 1404 also comprises the reducing agent.

Figure 14D:
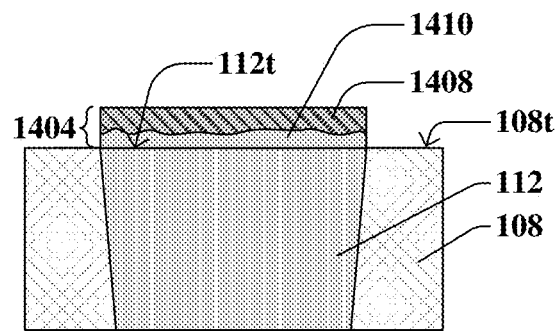

FIG. 14D illustrates a magnified, cross-sectional view 1400D of some embodiments of the anti-oxidation layer 1404 on the first conductive structure 112 that may correspond to box A of FIG. 14C. In some embodiments, the anti-oxidation layer 1404 comprises a lower portion 1408 that comprises mostly (e.g., greater than 50%) the inhibitor compound and comprises an upper portion 1410 arranged over the lower portion 1408 that comprises mostly (e.g., greater than 50%) the reducing agent. In some other embodiments, the anti-oxidation layer 1404 comprises a substantially random mixture of the inhibitor compound and the reducing agent and thus, does not have distinguishable upper and lower portions 1410, 1408. In some embodiments, the anti-oxidation layer 1404 has a thickness in a range of between, for example, approximately 1 angstrom and approximately 1000 angstroms.

Further, in some embodiments, the anti-oxidation layer 1404 does not form on the first dielectric layer 108 because the lone pair of electrons in the inhibitor compound are not attracted to the material of the first dielectric layer 108. Further, in some embodiments, because the anti-oxidation layer 1404 reduced previously present metal-oxide and prevents re-oxidation of the first conductive structure 112, the anti-oxidation layer 1404 aids in keeping the topmost surface 112t of the first conductive structure 112 substantially coplanar with the topmost surface 108t of the first dielectric layer 108. Thus, the topmost surfaces (112t, 108t) of the first conductive structure 112 and the first dielectric layer 108 may be cleaned and dried without sacrificing structure (e.g., substantially coplanar topmost surfaces 112t, 108t) of the first conductive structure 112 and first dielectric layer 108.

Figure 15:
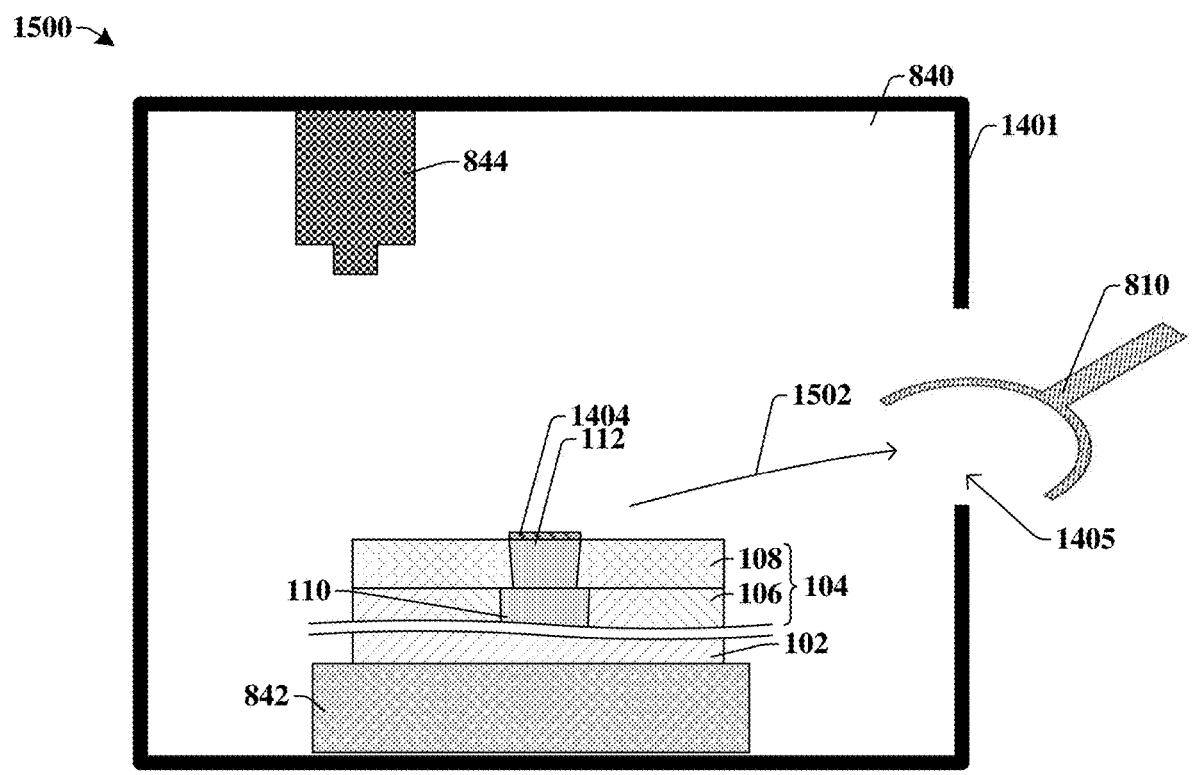

As shown in cross-sectional view 1500 of FIG. 15, in some embodiments, the drying chamber housing 1401 is opened 1405, and the substrate 102 is transported 1502 out of the post-planarization drying chamber 840 by the first transport robot 810. In some other embodiments, the second or third transport robots (822, 834 of FIG. 8) may instead remove the substrate 102 from the post-planarization drying chamber 840. Further, it will be appreciated that after the post-planarization drying process, the cleaning solution (1304 of FIG. 14A) is removed from the interconnect structure 104. In some embodiments, the substrate 102 may be transported back into one of the wafer storage units (804 of FIG. 8), and the wafer storage unit (804 of FIG. 8) may be transported from the planarization apparatus (802 of FIG. 8) to another processing chamber. In other embodiments, the first transport robot 810 may transport the substrate 102 to another processing chamber (not shown) separate from the planarization apparatus (802 of FIG. 8).

Figure 16A:
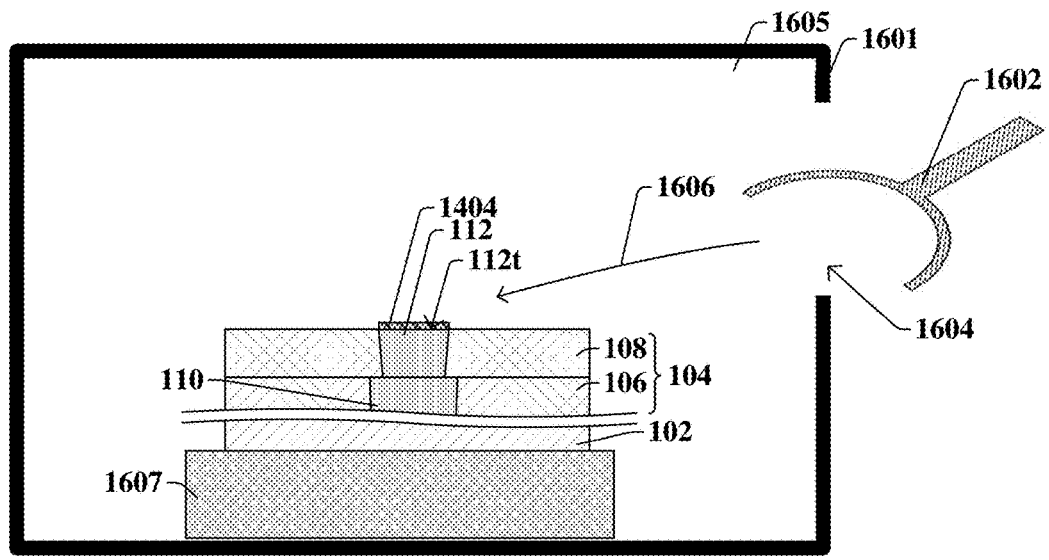

As shown in cross-sectional view 1600A of FIG. 16A, in some embodiments, another robot 1602 may be used to transport 1606 the substrate 102 from the wafer storage unit (804 of FIG. 8) onto a deposition wafer chuck 1607 within a deposition chamber 1605. In some embodiments, the deposition chamber 1605 is defined by a deposition chamber housing 1601, which is opened 1604 for the substrate 102 to be transported 1606 into the deposition chamber 1605. In some embodiments, the deposition chamber 1605 is configured to perform a deposition process (e.g., PVD, CVD, ALD, etc.) to deposit another material and form another layer over the first dielectric layer 108 and the first conductive structure 112. In some embodiments, the anti-oxidation layer 1404 remains on the first conductive structure 112 as the substrate 102 is transported between the planarization apparatus (802 of FIG. 8) and the deposition chamber 1605. Thus, the anti-oxidation layer 1404 prevents the topmost surface 112t from oxidizing between the planarization apparatus (802 of FIG. 8) and the deposition chamber 1605.

Figure 16B:
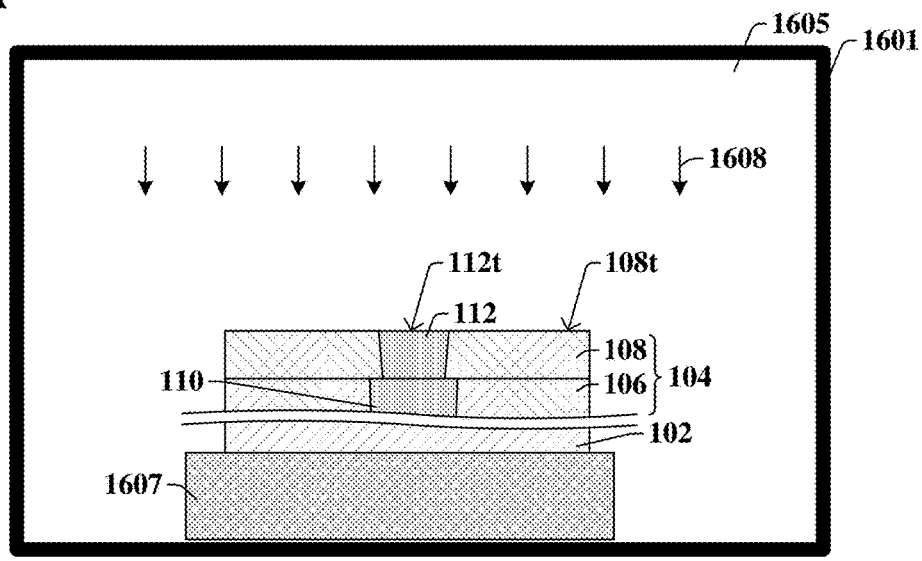

As shown in cross-sectional view 1600B of FIG. 16B, the deposition chamber housing 1601 is closed, and a removal process 1608 is then performed to remove the anti-oxidation layer (1404 of FIG. 16A) from the topmost surface 112t of the first conductive structure 112. In some embodiments, the removal process 1608 is a pre-clean step for the deposition process that will occur in the deposition chamber 1605. In some embodiments, because the anti-oxidation layer (1404 of FIG. 16A) does not comprise a metal-oxide, the removal process 1608 used may be less harsh, thereby mitigating removal and/or damage of the first conductive structure 112 and the first dielectric layer 108. For example, in some embodiments, the removal process 1608 may be or comprise a thermal degas process or by a plasma reactive preclean (RPC) process. In some such embodiments, the first conductive structure 112 and the first dielectric layer 108 are substantially resistant to removal by the removal process 1608. In some embodiments, when the removal process 1608 comprises a thermal degas process, the removal process 1608 may be conducted in a chamber set to a temperature between approximately 350 degrees Celsius and approximately 450 degrees Celsius for a time period in a range of between, for example, approximately 30 minutes and approximately 1.5 hours, for example.

In some other embodiments, because the removal process 1608 is a less harsh removal process, small amounts of the anti-oxidation layer (1404 of FIG. 16A) may remain on the first conductive structure 112. For example, in some embodiments, if hypophosphorous acid is used as the inhibitor compound and the reducing agent, small amounts of phosphate may be left on the topmost surface 112t of the first conductive structure 112 after the removal process 1608. However, in some such embodiments, although small amounts of the anti-oxidation layer (1404 of FIG. 16A) may be present, a substantial portion of the topmost surface 112t of the first conductive structure 112 is free from the anti-oxidation layer such that the contact resistance between the first conductive structure 112 and any additional conductive structures to be formed over the first conductive structure 112 is not significantly effected.

Because the anti-oxidation layer (1404 of FIG. 16A) removed and/or prevent metal-oxide on the first conductive structure 112 and because the removal process 1608 is not very harsh to remove the anti-oxidation layer (1404 of FIG. 16A), a post-planarization cleaning process can be performed while maintaining the substantially coplanar topmost surfaces (112t, 108t) of the first conductive structure 112 and of the first dielectric layer 108 to improve the reliability of the overall device.

Figure 17:
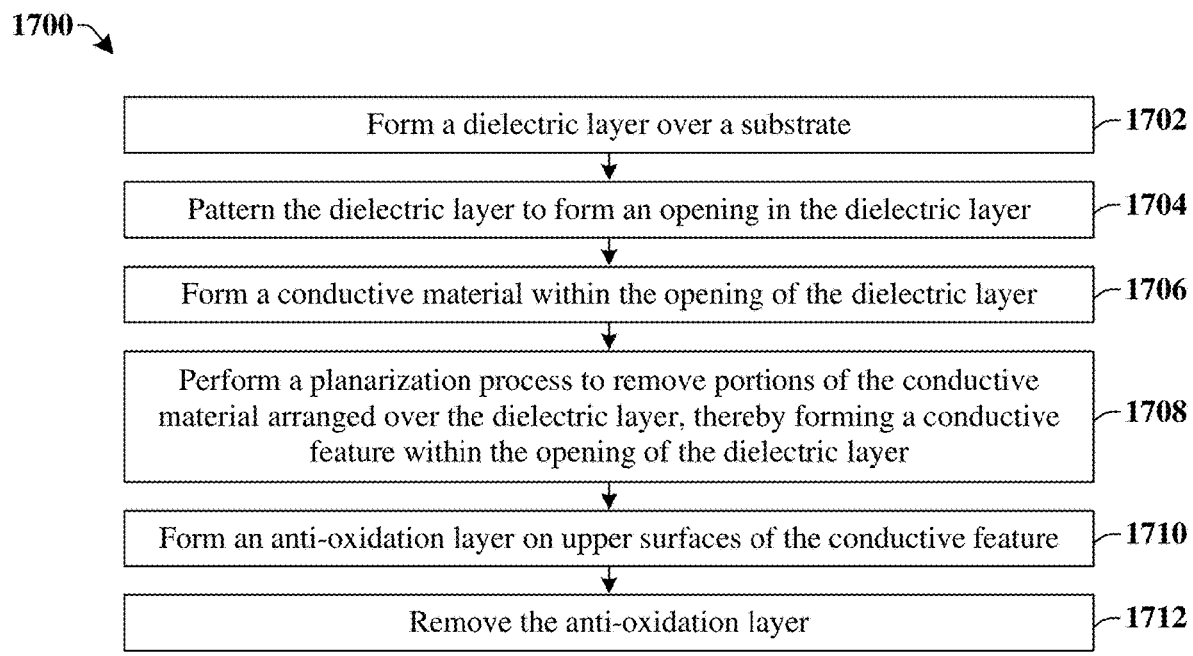
FIG. 17 illustrates a flow diagram of some embodiments of a method corresponding to the method illustrated in FIGS. 5-16.

FIG. 17 illustrates a flow diagram of some embodiments of a method 1700 corresponding to the method illustrated in FIGS. 5-16B.

While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1702, a dielectric layer is formed over a substrate. FIG. 5 illustrates a cross-sectional view 500 of some embodiments corresponding to act 1702.

At act 1704, the dielectric layer is patterned to form an opening in the dielectric layer. FIG. 6 illustrates a cross-sectional view 600 of some embodiments corresponding to act 1704.

At act 1706, a conductive material is formed within the opening of the dielectric layer. FIG. 7 illustrates a cross-sectional view 700 of some embodiments corresponding to act 1702.

At act 1708, a planarization process is performed to remove portions of the conductive material arranged over the dielectric layer, thereby forming a conductive feature within the opening of the dielectric layer. FIGS. 10 and 11 illustrate cross-sectional views 1000 of some embodiments corresponding to act 1708.

At act 1710, an anti-oxidation layer is formed on upper surfaces of the conductive feature. FIG. 14C illustrates a cross-sectional view 1400C of some embodiments corresponding to act 1710.

At act 1712, the anti-oxidation layer is removed. FIG. 16B illustrates a cross-sectional view 1600B of some embodiments corresponding to act 1712.

Therefore, the present disclosure relates to forming an anti-oxidation layer comprising reducing agents and inhibitor compounds over a topmost surface of a conductive feature after a planarization process to remove metal oxide residue and/or prevent metal oxide residue from forming on a conductive feature during various post-planarization processing steps.

Accordingly, in some embodiments, the present disclosure relates to a method comprising: forming a dielectric layer over a substrate; patterning the dielectric layer to form an opening in the dielectric layer; forming a conductive material within the opening of the dielectric layer; performing a planarization process to remove portions of the conductive material arranged over the dielectric layer thereby forming a conductive feature within the opening of the dielectric layer; forming an anti-oxidation layer on upper surfaces of the conductive feature; and removing the anti-oxidation layer.

In other embodiments, the present disclosure relates to a method comprising: forming a dielectric layer over a substrate; patterning the dielectric layer to form an opening in the dielectric layer; forming a conductive material within the opening of the dielectric layer; performing a planarization process to remove portions of the conductive material arranged over the dielectric layer thereby forming a conductive feature within the opening of the dielectric layer, wherein the planarization process is performed in a first processing chamber; transporting the substrate from the first processing chamber to a second processing chamber; performing a post-planarization cleaning process in the second processing chamber to clean a topmost surface of the conductive feature and a topmost surface of the dielectric layer; transporting the substrate from the second processing chamber to a third processing chamber; performing a post-planarization drying process in the third processing chamber; forming an anti-oxidation layer on the topmost surface of the conductive feature; and removing the anti-oxidation layer from the topmost surface of the conductive feature.

In yet other embodiments, the present disclosure relates to a device comprising: a first dielectric layer arranged over a substrate; a first conductive structure arranged within the first dielectric layer; a second dielectric layer arranged over the first conductive structure and the first dielectric layer; and a second conductive structure arranged within the second dielectric layer and directly contacting the first conductive structure, wherein the second conductive structure comprises a topmost surface that is wider than a bottommost surface of the second conductive structure, and wherein the topmost surface of the second conductive structure is substantially coplanar with a topmost surface of the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a device comprising:
   forming a first dielectric layer over a substrate;
   forming a first conductive structure within the first dielectric layer;
   performing a planarization process such that a top surface of the first dielectric layer is coplanar with a top surface of the first conductive structure; and
   performing a post-planarization drying process to form an anti-oxidation layer, wherein the post-planarization drying process uses a mixture of a drying solution, a reducing agent, and an inhibitor compound, wherein the mixture contains hypophosphorous acid.

2. The method of claim 1, further comprising:
   exposing the substrate to oxygen after the planarization process and before the post-planarization drying process; and
   exposing the substrate to oxygen after the post-planarization drying process.

3. The method of claim 1, wherein the mixture contains isopropyl alcohol.

4. The method of claim 1, wherein the first conductive structure comprises tungsten.

5. The method of claim 1, further comprising removing the anti-oxidation layer.

6. The method of claim 5, wherein the removing of the anti-oxidation layer includes a thermal degas process.

7. The method of claim 5, wherein the removing of the anti-oxidation layer includes a plasma reactive preclean process.

8. A method for forming a device comprising:
   forming a first dielectric layer over a substrate;
   forming a first conductive structure within the first dielectric layer;
   performing a planarization process such that a top surface of the first dielectric layer is coplanar with a top surface of the first conductive structure; and
   performing a post-planarization drying process to form an anti-oxidation layer, wherein the post-planarization drying process uses a mixture containing $HOP(O)H_2$ and $HP(OH)_2$.

9. The method of claim 8, wherein the first conductive structure comprises tungsten.

10. The method of claim 8, wherein the substrate is exposed to oxygen after the planarization process and before the post-planarization drying process.

11. The method of claim 8, wherein the mixture also includes a drying solution.

12. The method of claim 11, wherein the drying solution is isopropyl alcohol.

13. The method of claim 8, wherein the $HOP(O)H_2$ and the $HP(OH)_2$ are in equilibrium in the mixture.

14. The method of claim 8, further comprising:
   performing a thermal degas or plasma reactive preclean process after the post-planarization drying process.

15. A method for forming a device comprising:
   forming a first dielectric layer over a substrate;
   forming a first conductive structure within the first dielectric layer;
   performing a planarization process such that a top surface of the first dielectric layer is coplanar with a top surface of the first conductive structure;

after the planarization process, exposing the substrate to an environment containing oxygen; and performing a post-planarization drying process to form an anti-oxidation layer, wherein the post-planarization drying process uses hypophosphorous acid.

16. The method of claim 15, further comprising:

exposing a top surface of the substrate to oxygen; and performing a removal process, wherein the removal process removes a portion of the anti-oxidation layer.

17. The method of claim 16, wherein the removal process is a plasma reactive preclean process.

18. The method of claim 16, wherein the removal process is a thermal degas process.

19. The method of claim 18, wherein the thermal degas process takes place at a temperature between about 350 degrees Celsius and 450 degrees Celsius.

20. The method of claim 19, wherein the thermal degas process lasts for a period of about 30 minutes to about 1.5 hours.

* * * * *